United States Patent
Chen et al.

(10) Patent No.: US 9,917,084 B2
(45) Date of Patent: Mar. 13, 2018

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Fang Chen, Hsinchu (TW); Jhon Jhy Liaw, Hsinchu County (TW); Min-Chang Liang, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/090,202

(22) Filed: Apr. 4, 2016

(65) Prior Publication Data

US 2017/0221891 A1    Aug. 3, 2017

Related U.S. Application Data

(60) Provisional application No. 62/289,153, filed on Jan. 29, 2016.

(51) Int. Cl.
| | |
|---|---|
| *H01L 23/528* | (2006.01) |
| *H01L 27/088* | (2006.01) |
| *H01L 21/8234* | (2006.01) |
| *H01L 29/51* | (2006.01) |
| *H01L 29/49* | (2006.01) |

(52) U.S. Cl.
CPC .. *H01L 27/0886* (2013.01); *H01L 21/823431* (2013.01); *H01L 21/823475* (2013.01); *H01L 23/528* (2013.01); *H01L 29/495* (2013.01); *H01L 29/4966* (2013.01); *H01L 29/4975* (2013.01); *H01L 29/517* (2013.01)

(58) Field of Classification Search
CPC ......... H01L 27/0886; H01L 21/823431; H01L 21/823475; H01L 29/495; H01L 29/4966; H01L 29/4975; H01L 29/517
See application file for complete search history.

(56) References Cited

U.S. PATENT DOCUMENTS

| | | | | |
|---|---|---|---|---|
| 9,490,317 | B1 * | 11/2016 | Labonte | H01L 29/78 |
| 2013/0248950 | A1 * | 9/2013 | Kang | H01L 29/78 257/288 |
| 2013/0299771 | A1 * | 11/2013 | Youn | H01L 21/845 257/9 |
| 2014/0175567 | A1 * | 6/2014 | Barabash | H01L 21/3105 257/410 |

(Continued)

*Primary Examiner* — Christine Enad
(74) *Attorney, Agent, or Firm* — McDermott Will & Emery LLP

(57) ABSTRACT

A semiconductor device includes a fin field effect transistor. The semiconductor device includes a first gate electrode, a first source/drain (S/D) region disposed adjacent to the first gate electrode, a first S/D contact disposed on the first S/D region, a first spacer layer disposed between the first gate electrode and the first S/D region, a first contact layer in contact with the first gate electrode and the first S/D contact, and a first wiring layer integrally formed with the first contact layer. There is no interface between the first contact layer and the first wiring layer in a cross sectional view, and the first contact layer has a smaller area than the first wiring layer in plan view.

21 Claims, 12 Drawing Sheets

(56) References Cited

U.S. PATENT DOCUMENTS

| | | | | |
|---|---|---|---|---|
| 2014/0264479 A1* | 9/2014 | Cai | ............... | H01L 29/401 257/288 |
| 2014/0339629 A1* | 11/2014 | Xie | ............... | H01L 29/7827 257/330 |
| 2014/0349476 A1* | 11/2014 | Chen | ............... | H01L 21/76816 438/620 |
| 2015/0340467 A1* | 11/2015 | Bouche | ............... | H01L 29/66795 257/401 |
| 2015/0340488 A1* | 11/2015 | Leobandung | ............... | H01L 29/785 257/401 |
| 2015/0372100 A1* | 12/2015 | Zschatzsch | ............... | H01L 29/41725 257/384 |

\* cited by examiner

US 9,917,084 B2

SEMICONDUCTOR DEVICE AND A METHOD FOR FABRICATING THE SAME

CROSS-REFERENCE TO RELATED APPLICATIONS

This application claims priority to U.S. Provisional Patent Application 62/289,153 filed Jan. 29, 2016, the entire disclosure of which is incorporated herein by reference.

TECHNICAL FIELD

The disclosure relates to a method for manufacturing a semiconductor device, and more particularly to a structure and a manufacturing method for a conductive layer over a gate and source/drain regions.

BACKGROUND

As the semiconductor industry introduces new generations of integrated circuits (ICs) having higher performance and greater functionality, multi-layer metal wiring structures disposed over the underlying electronic devices such as transistors have been employed. To meet requirements for a higher speed and a more reliability, advanced metal wire forming methods and structures have been developed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
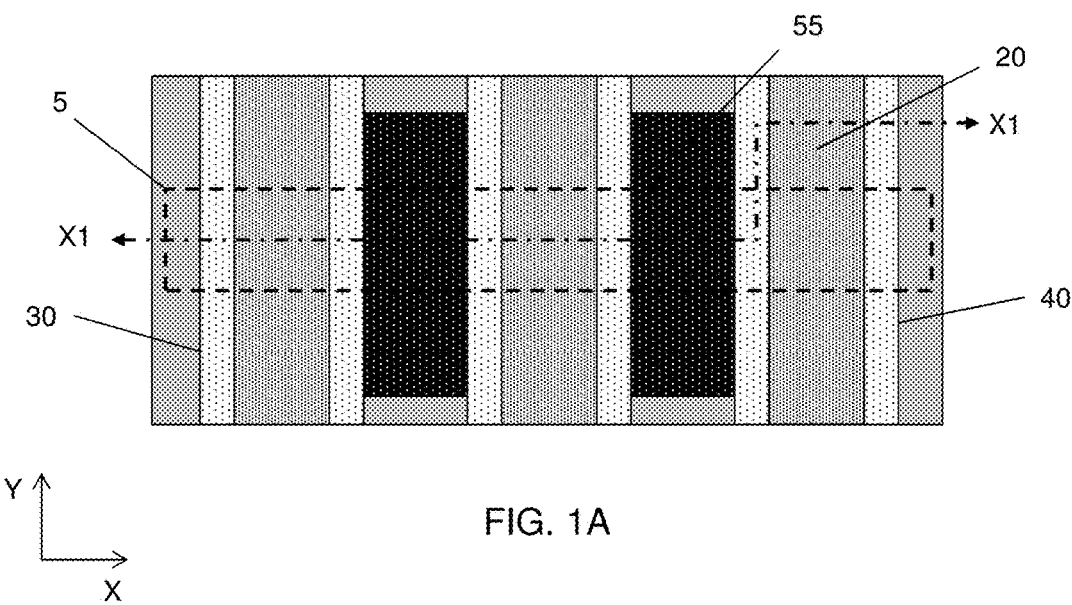
FIG. 1A shows an exemplary plan view (viewed from the above) illustrating one of the various stages of a sequential fabrication process of a semiconductor device according to one embodiment of the present disclosure.
Figure 1B:
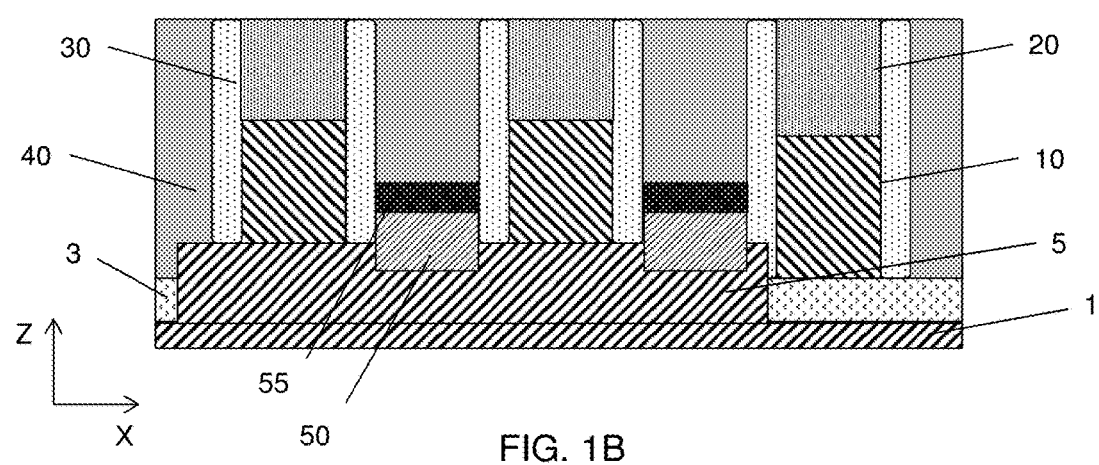
FIG. 1B shows an exemplary cross sectional view along line X1-X1 of FIG. 1A.

FIGS. 1A and 1B show one of the stages of a sequential fabrication process of a semiconductor device according to one embodiment of the present disclosure. FIG. 1A shows a plan (top) view and FIG. 1B shows a cross sectional view along line X1-X1 of FIG. 1A.

Figure 2:
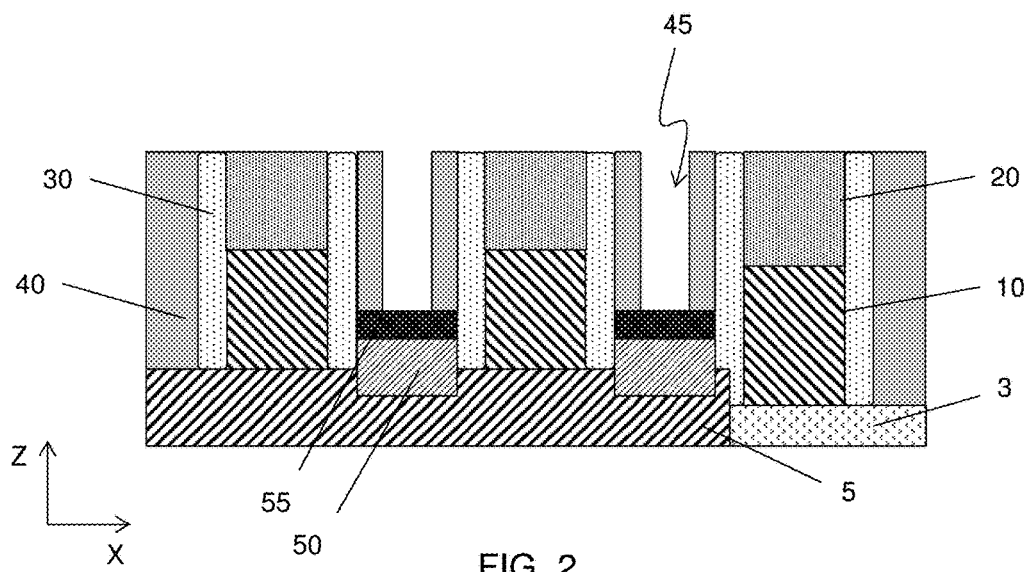
FIGS. 2-6B show exemplary cross sectional views corresponding to line X1-X1 of FIG. 1A illustrating various stages of the sequential fabrication process of a semiconductor device according to one embodiment of the present disclosure.

FIGS. 1A and 1B show a structure of a semiconductor device after metal gate structures are formed. In FIGS. 1A and 1B, metal gate structures 10 are formed over a channel layer, for example, a part of a fin structure 5, and cap insulating layers 20 are disposed over the metal gate structures 10. The fin structure 5 is disposed over a substrate 1 and protrudes from an isolation insulating layer 3. In FIG. 2 and thereafter, the substrate 1 and the isolation insulating layer 3 are omitted. The thickness of the metal gate structures 10 is in a range from 15 nm to 50 nm in some embodiments. The thickness of the cap insulating layer 20 is in a range from about 10 nm to about 30 nm in some embodiments, and is in a range from about 15 nm to about 20 nm in other embodiments. Sidewall spacers 30 are provided on sidewalls of the metal gate structure 10 and the cap insulating layer 20. The film thickness of the sidewall spacers 30 at the bottom of the sidewall spacers is in a range from about 3 nm to about 15 nm in some embodiments, and is in a range from about 4 nm to about 10 nm in other embodiments. The combination of the metal gate structure 10, the cap insulating layer 20 and sidewall spacers 30 may be collectively referred to as a gate structure. Further, source/drain (S/D) regions 50 are formed adjacent to the gate structures, and spaces between the gate structures are filled with a first interlayer dielectric (ILD) layer 40. A silicide layer 55 is further formed on the S/D region 50. In the present disclosure, a source and drain are interchangeably used and there is substantially no structural difference. The term "a source/drain" (an S/D) refers to one of a source and a drain.

The silicide layer 55 includes one or more of cobalt silicide, titanium silicide, nickel silicide, copper silicide, tungsten silicide, and molybdenum silicide.

Figure 1C:
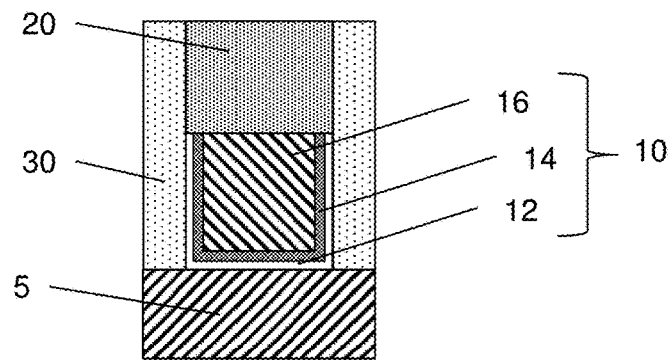
FIG. 1C is an enlarged view of the gate structure.

FIG. 1C is an enlarged view of the gate structure. The metal gate structure 10 includes one or more layers 16 of metal material, such as Al, Cu, W, Ti, Ta, TiN, TiAl, TiAlC, TiAlN, TaN, NiSi, CoSi, and other conductive materials. A gate dielectric layer 12 disposed between the channel layer 5 and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers 14 are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material such as silicon nitride based material including SiN, SiCN and SiOCN. The sidewall spacer 30 is made of a different material than the cap insulating layer 20 and includes one or more layers of insulating material such as silicon nitride based material including SiN, SiON, SiCN and SiOCN. The sidewall spacer 30 may be made of the same material as the cap insulating layer 20. The first ILD layer 40 includes one or more layers of silicon oxide, SiOC, SiOCN or SiCN or other low-k materials, or porous materials. The first ILD layer 40 can be formed by LPCVD (low pressure chemical vapor deposition), plasma-CVD or other suitable film forming methods.

In some embodiments, the material of the sidewall spacer 30, the material of the cap insulating layer 20, and a material of the first ILD layer 40 are different from each other, so that each of these layers can be selectively etched. In one embodiment, the sidewall spacer 30 is made of SiOCN, SiCN or SiON, the cap insulating layer 20 is made of SiN, and the first ILD 40 layer is made of $SiO_2$. In other embodiments, at least two of the sidewall spacer 30, the cap insulating layer 20, and the first ILD layer 40 are made of the same material.

In this embodiment, fin field effect transistors (Fin FETs) fabricated by a gate-replacement process are employed.

Figure 1D:
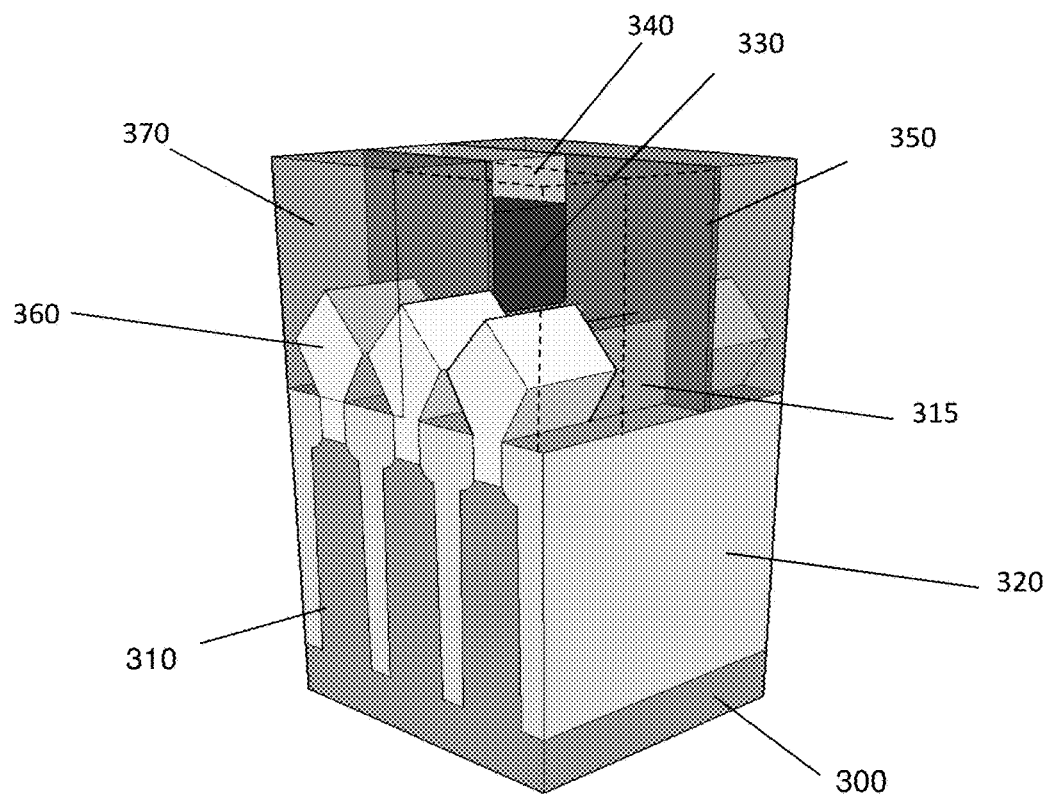
FIG. 1D shows an exemplary perspective view illustrating one of the various stages of a sequential fabrication process of a semiconductor device according to one embodiment of the present disclosure.

FIG. 1D shows an exemplary perspective view of a Fin FET structure. The Fin FET structure can be fabricated by the following operations.

First, a fin structure 310 is fabricated over a substrate 300. The fin structure includes a bottom region and an upper region as a channel region 315. The substrate is, for example, a p-type silicon substrate with an impurity concentration in a range from about $1 \times 10^{15}$ $cm^{-3}$ to about $1 \times 10^{18}$ $cm^{-3}$. In other embodiments, the substrate is an n-type silicon substrate with an impurity concentration in a range from about $1 \times 10^{15}$ $cm^{-3}$ to about $1 \times 10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD, plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. The ILD layer 370 includes one or more layers of silicon oxide, SiOC, SiOCN or SiCN or other low-k materials, or porous materials. After a planarization operation, the dummy gate structure is removed so as to make a gate space. Then, in the gate space, a metal gate structure 330 including a metal gate electrode and a gate dielectric layer, such as a high-k dielectric layer, is formed. Further, the cap insulating layer 340 is formed over the metal gate structure 330, so as to obtain the Fin FET structure shown in FIG. 1D. In FIG. 1D, parts of the metal gate structure 330, the cap isolation layer 340, sidewalls 330 and the ILD 370 are cut to show the underlying structure.

The metal gate structure 330, the cap isolation layer 340, sidewalls 330, source/drain 360 and the ILD 370 of FIG. 1D substantially correspond to the metal gate structures 10, cap insulating layers 20, sidewall spacers 30, source/drain regions 50 and first interlayer dielectric layer (ILD) 40, of FIGS. 1A and 1B, respectively.

FIGS. 2-6B show exemplary cross sectional views corresponding to line X1-X1 of FIG. 1A, illustrating various stages of the sequential fabrication process of a semiconductor device according to one embodiment of the present disclosure. It is understood that additional operations can be provided before, during, and after processes shown by FIGS. 2-6B, and some of the operations described below can be replaced or eliminated for additional embodiments of the method. The order of the operations/processes may be interchangeable.

As shown in FIG. 2, the first ILD layer 40 over the S/D regions is etched to form an opening 45 by using a lithography process and a dry etching process. In FIG. 2, the first ILD layer 40 remains on the walls of the opening 45. In some embodiments, the first ILD layer 40 over the S/D regions is fully removed. In some embodiments, an additional ILD layer is formed over the first ILD layer 40 and then the openings 45 are formed.

Figure 3:
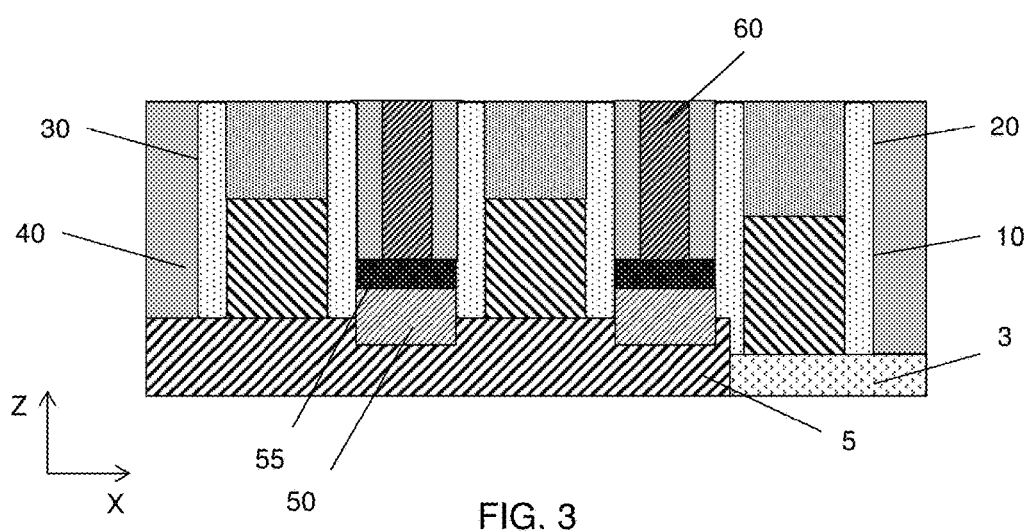

Then, as shown in FIG. 3, an S/D contact 60 is formed in the opening 45 to contact the silicide layer 55 of the SD region. After the openings 45 are formed, a blanket layer of a conductive material is formed over the structure of FIG. 2. The conductive material layer includes one or more layers of conductive material, such as Co, W, Ni, Mo or Cu. In one embodiment, W is used. The conductive material layer can be formed by CVD, physical vapor deposition (PVD) including sputtering, atomic layer deposition (ALD), electro-plating or a combination thereof, or other suitable film forming methods.

In some embodiments, an adhesive layer is formed before forming the conductive material layer. The adhesive layer includes one or more layers of conductive materials, such as TiN and Ti. The adhesive layer can be formed by CVD, PVD, ALD, electro-plating or a combination thereof, or other suitable film forming methods. The adhesive layer is used to prevent the conductive material layer from peeling off.

After the "thick" conductive material layer is formed, a planarization operation, such as chemical mechanical polishing (CMP) or an etch-back operation, is performed so as to remove the conductive material layer deposited on the upper surface of the first ILD layer 40, thereby forming the S/D contact 60, as shown in FIG. 3.

Figure 4:
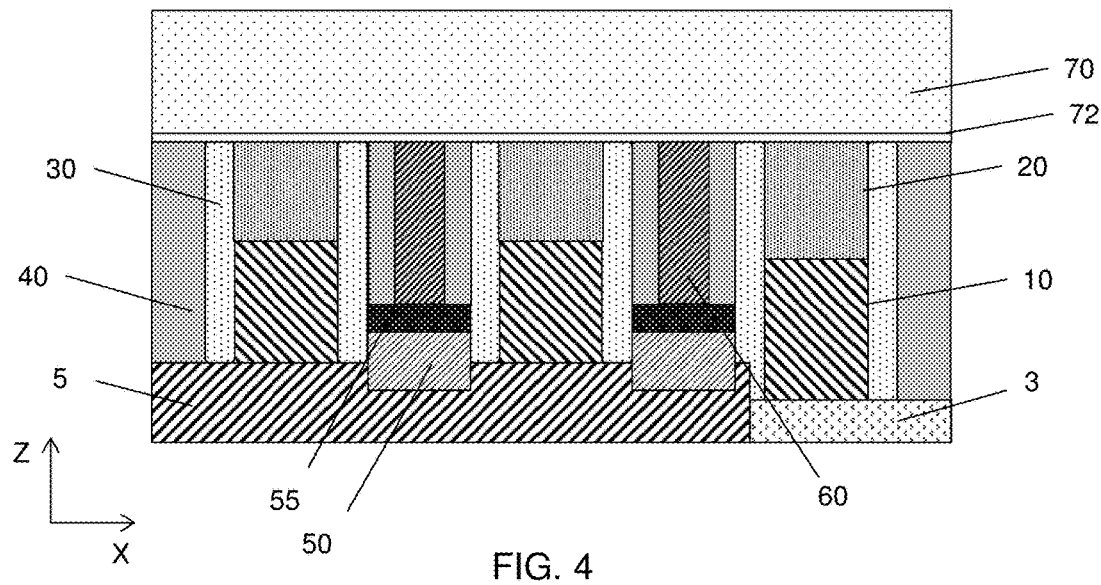

After the S/D contact 60 is formed, a second ILD layer 70 is formed over the structure of FIG. 4. The material and forming process are similar to those of the first ILD layer 40. In some embodiments, a contact etch stop layer (CESL) 72 made by, for example, SiN, SiC or SiCN, is formed between the first ILD layer 40 and the second ILD layer 70.

Figure 5:
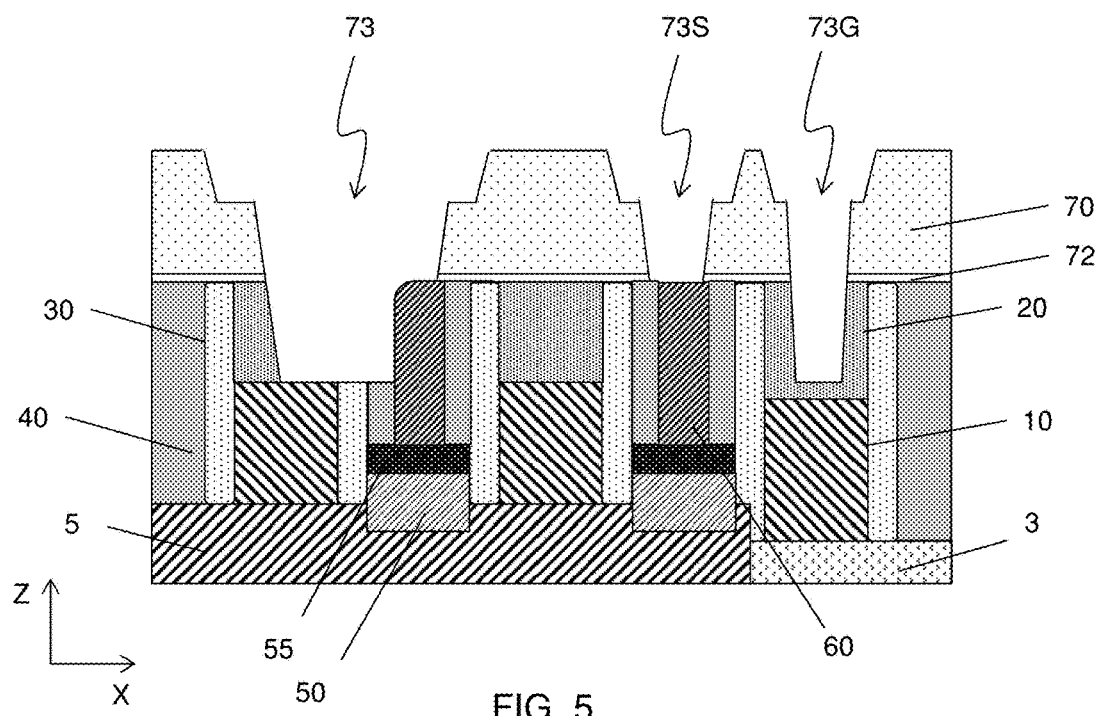

Then, a contact layer and a wiring layer are formed by using a damascene technique. The damascene technique may be a single damascene technique or a dual damascene technique. As shown in FIG. 5, contact openings 73, 73G and 73S are formed in the first and second ILD layers and the cap insulating layer, so as to at least partially expose the S/D contact 60 and the upper surfaces of the metal gate 10 of the gate structure. The contact opening 73 is formed to expose both the S/D contact 60 and the metal gate 10, the contact opening 73S is formed to expose the upper surface of the S/D contact 60, and the contact opening 73G is formed to expose the upper surface of the metal gate 10.

As shown in FIG. 5, each of the contact openings 73, 73G and 73S includes an upper portion for a wiring layer and a lower portion for a contact layer. In some embodiments, the upper portion is first formed in the second ILD layer 70 by using a lithography operation and a dry etching operation, and then the lower portion is formed by using a lithography operation and a dry etching operation.

Figure 6A:
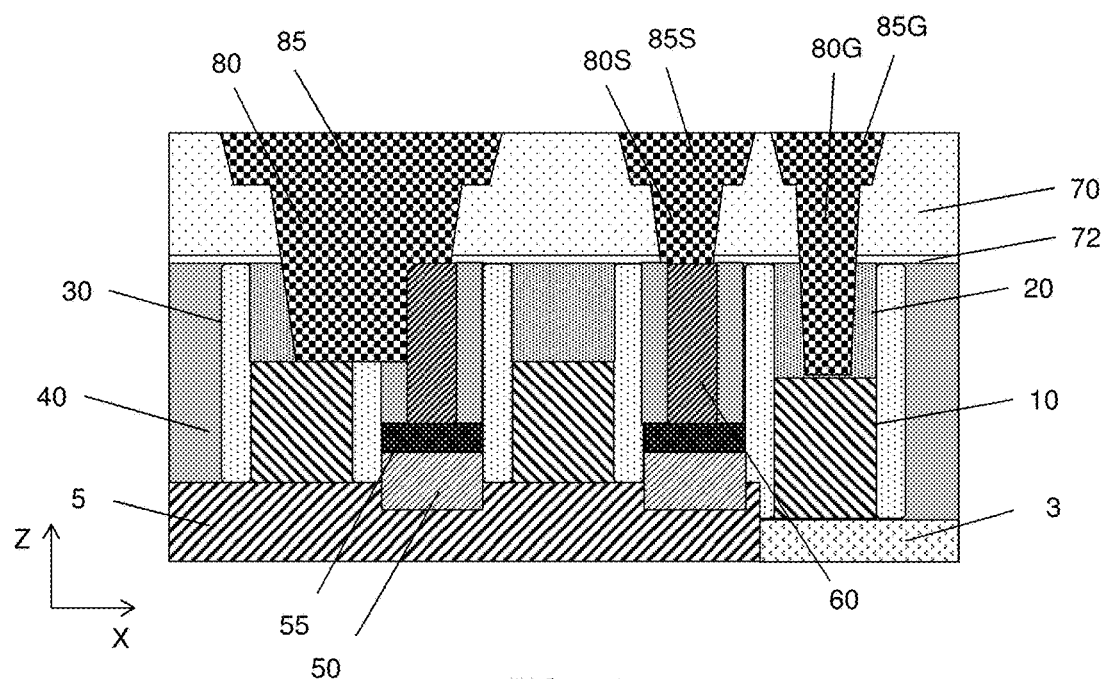
Figure 6B:
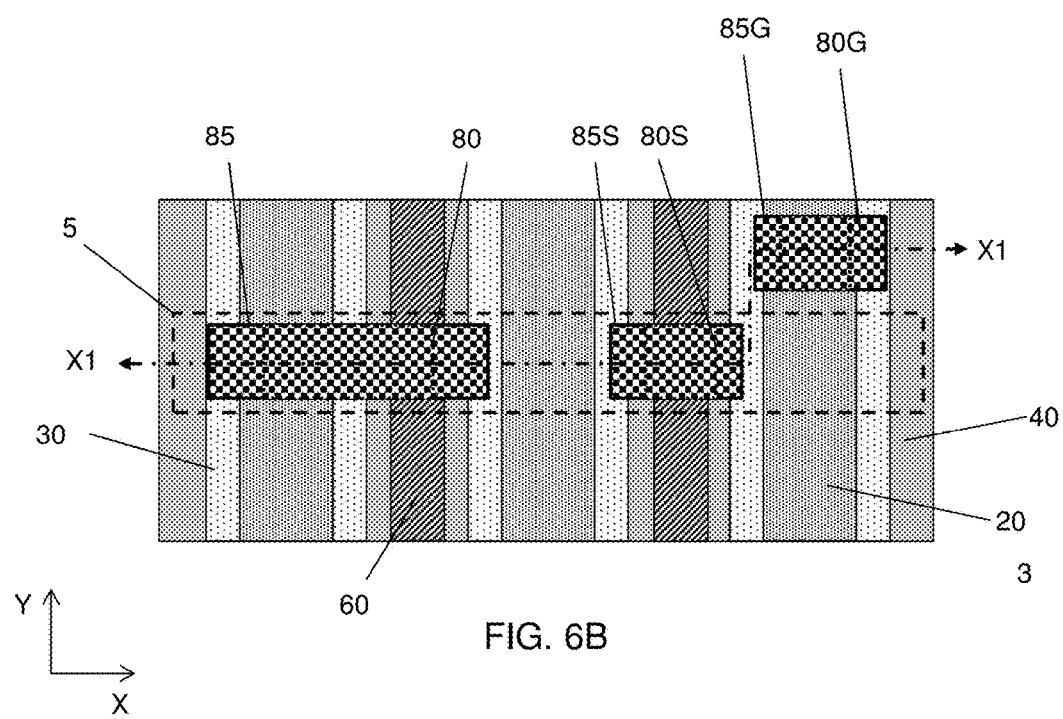

After the contact openings 73, 73G and 73S are formed, a thick second conductive material layer is formed over the structure of FIG. 5, and a planarization operation, such as CMP, is performed to obtain the structure as shown in FIGS. 6A and 6B. FIG. 6B is a plan view and FIG. 6A corresponds to the line X1-X1 of FIG. 6B.

The second conductive material layer includes one or more layers of conductive materials, such as TiN, Ti, Cu, Al, W or an alloy thereof or other suitable materials, formed by CVD, PVD, ALD or electroplating or other suitable methods.

The contact opening 73 is filled with the second conductive material, thereby forming a contact layer 80 and a wiring layer 85, which constitute an integrally formed structure.

The contact layer 80 is in contact with the metal gate 10 and the S/D contact 60, thereby electrically connecting the metal gate 10 and the S/D region 50. The contact opening 73G is filled with the second conductive material, thereby forming a contact layer 80G and a wiring layer 85G. The contact layer 80G is in contact with the metal gate 10. The contact opening 73S is filled with the second conductive material, thereby forming a contact layer 80S and a wiring layer 85S. The contact layer 80S is in contact with the S/D contact 60.

As shown in FIG. 6B, the contact layer 80 and the wiring layer 85 overlap the fin structure 5. The contact layer 80S and the wiring layer 85S also overlap the fin structure 5, while contact layer 80G and the wiring layer 85G do not overlap the fin structure 5.

There is no interface or boundary between the contact layers 80, 80G or 80S and the wiring layers 85, 85G or 85S, respectively in the cross sectional view. Further, the contact layers 80, 80G or 80S have smaller areas than the wiring layers 85, 85G or 85S, respectively, in plan view.

FIGS. 7-11B show exemplary cross sectional views corresponding to line X1-X1 of FIG. 1A, illustrating various stages of the sequential fabrication process of a semiconductor device according to another embodiment of the present disclosure. It is understood that additional operations can be provided before, during, and after processes shown by FIGS. 7-11B, and some of the operations described below can be replaced or eliminated for additional embodiments of the method. The order of the operations/processes may be interchangeable. The configurations, structures, material, processes and/or operations similar to or the same as the foregoing embodiments described with FIGS. 2-6B may be employed in the following embodiments, and the detailed explanation thereof may be omitted.

Figure 7:
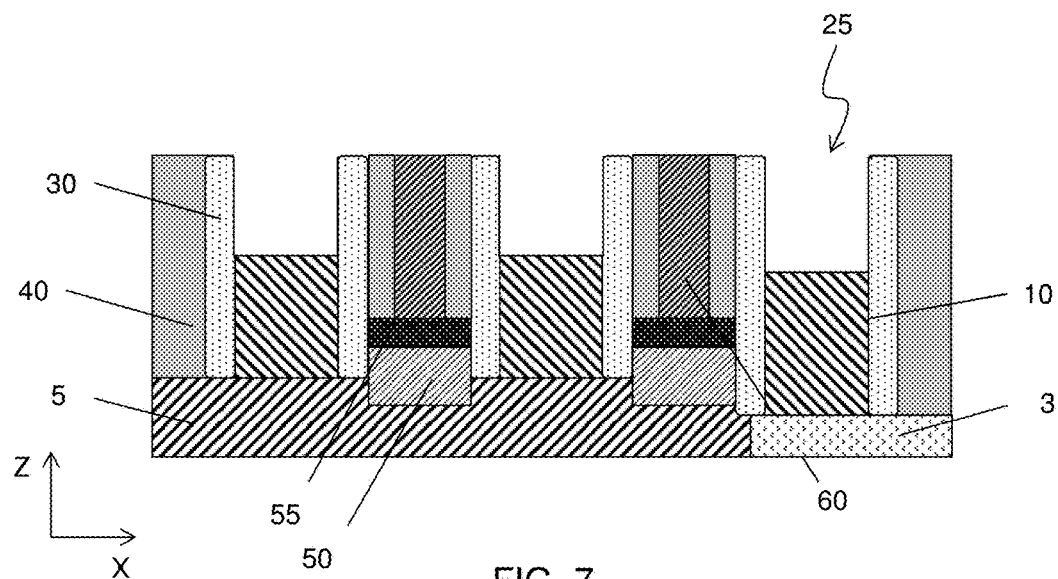
FIGS. 7-11B show exemplary cross sectional views according to another embodiment of the present disclosure.

After the structure of FIG. 3 is formed, cap insulating layers 20 are removed, thereby forming gate spaces 25, as shown in FIG. 7. In FIG. 7, the cap insulating layers 20 are fully removed to expose metal gate 10. In other embodiments, the cap insulating layers 20 are partially removed to expose metal gate 10 such that the cap insulating layers 20 remain on the walls of the gate openings 25. In some embodiments, the additional ILD layer is formed over the first ILD layer 40 and the gate openings 25 are formed through the additional ILD layer.

Figure 8:
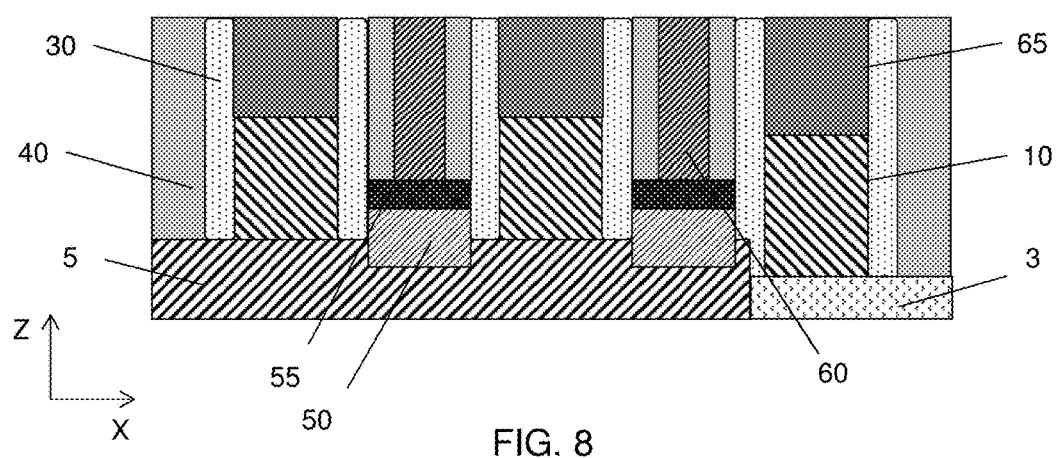

After the gate openings 25 are formed, gate contacts 65 are formed over the exposed metal gate 10, as shown in FIG. 8. A blanket layer of a conductive material is formed over the structure of FIG. 7. The conductive material layer includes one or more layers of conductive material, such as Co, W, Ni, Mo or Cu. In one embodiment, W is used. The conductive material layer can be formed by CVD, physical vapor deposition (PVD) including sputtering, atomic layer deposition (ALD), electro-plating or a combination thereof, or other suitable film forming methods.

In some embodiments, an adhesive layer is formed before forming the conductive material layer. The adhesive layer includes one or more layers of conductive materials, such as TiN and Ti. The adhesive layer can be formed by CVD, PVD, ALD, electro-plating or a combination thereof, or other suitable film forming methods. The adhesive layer is used to prevent the conductive material layer from peeling off.

After the "thick" conductive material layer is formed, a planarization operation, such as chemical mechanical polishing (CMP) or etch-back operations, is performed so as to remove the conductive material layer deposited on the upper surface of the first ILD layer 40, thereby forming the gate contacts 65, as shown in FIG. 8.

Figure 9:
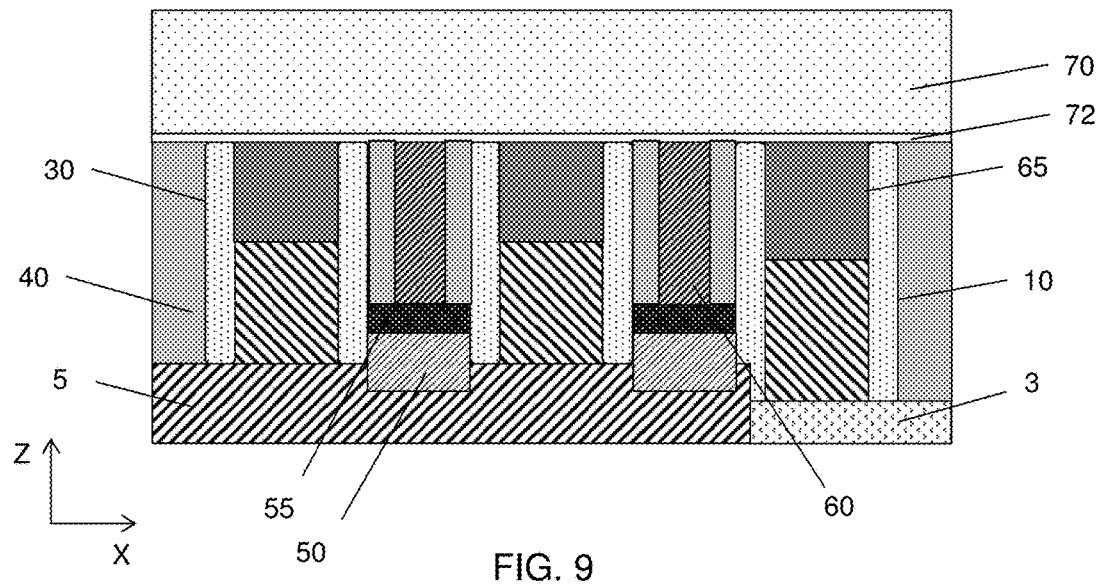

Similar to FIG. 4, after the gate contacts 65 are formed, a second ILD layer 70 and a CESL 72 are formed, as shown in FIG. 9.

Figure 10:
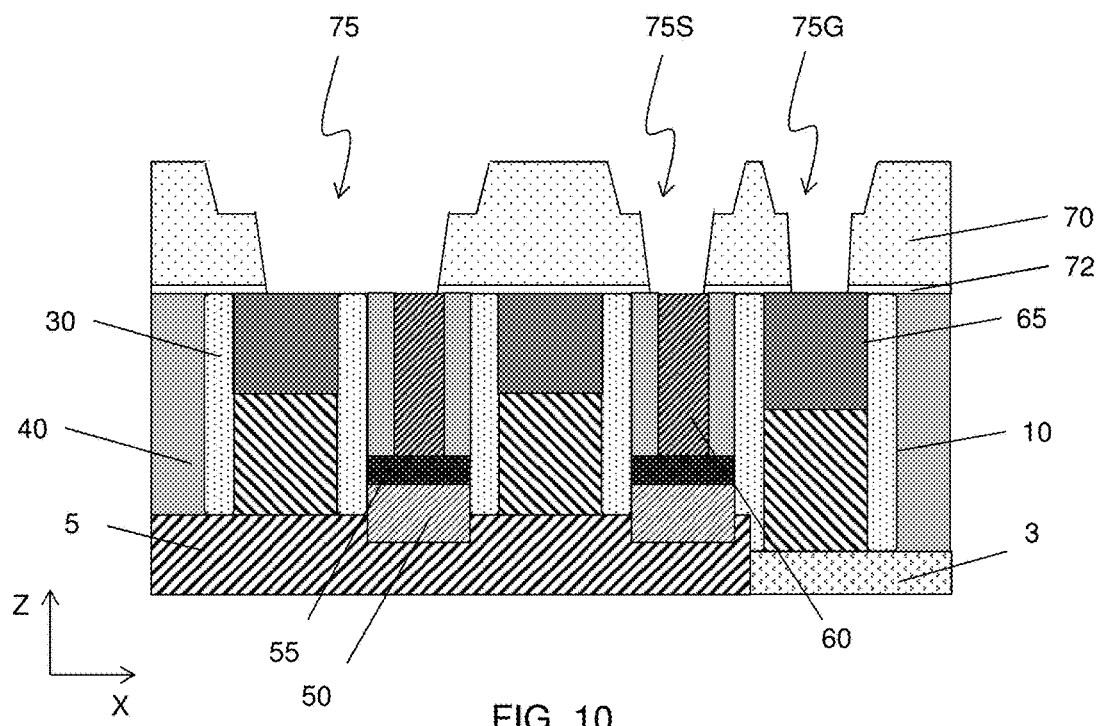

Then, similar to FIG. 5, contact openings 75, 75G and 75S are formed in the second ILD layer, so as to at least partially expose the gate contacts 65 and the S/D contact 60, as shown in FIG. 10. The contact opening 75 is formed to expose both the S/D contact 60 and the gate contact 65, the contact opening 75S is formed to expose the upper surface of the S/D contact 60, and the contact opening 75G is formed to expose the upper surface of the gate contact 65.

Figure 11A:
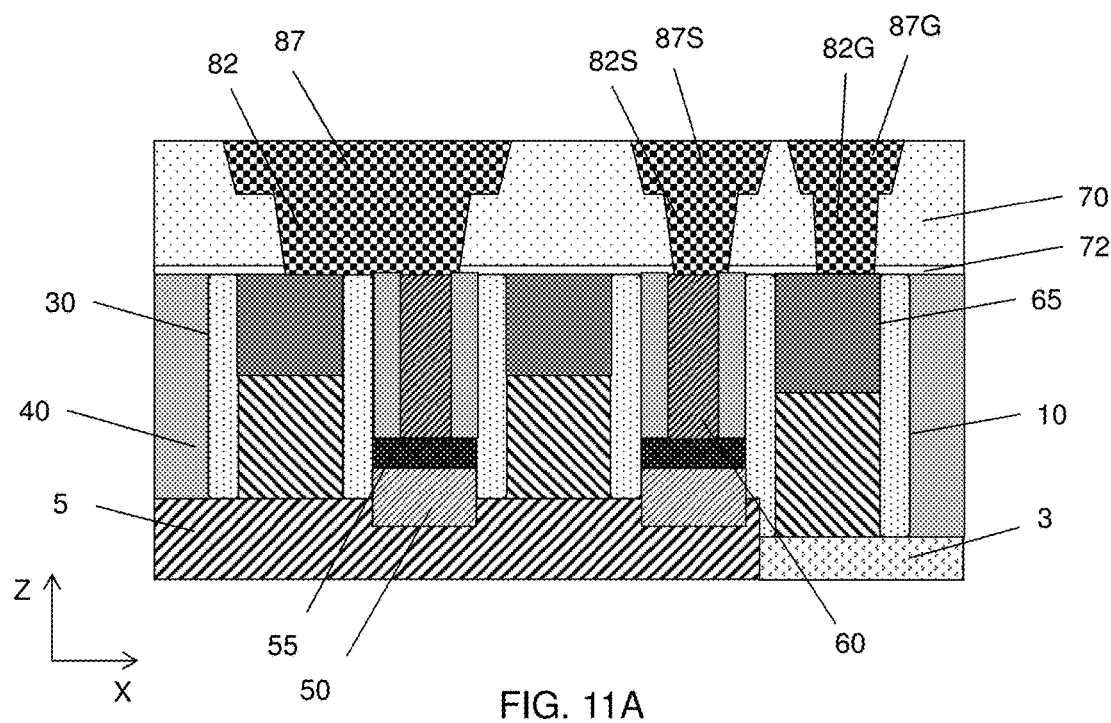
Figure 11B:
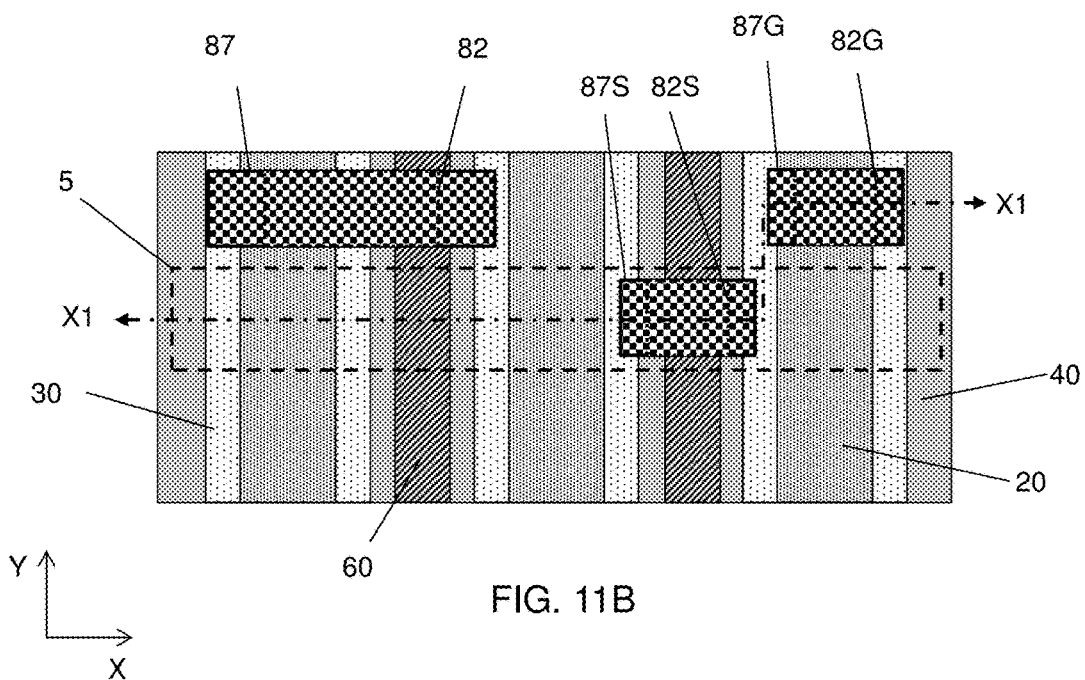

Similar to FIGS. 6A and 6B, after the contact openings 75, 75G and 75S are formed, a thick second conductive material layer is formed over the structure of FIG. 10, and a planarization operation, such as CMP, is performed to obtain the structure as shown in FIGS. 11A and 11B. FIG. 11B is a plan view and FIG. 11A corresponds to the line X1-X1 of FIG. 11B.

The contact opening 75 is filled with the second conductive material, thereby forming a contact layer 82 and a wiring layer 87. The contact layer 82 is in contact with the gate contact 65 and the S/D contact 60, thereby electrically connecting the metal gate 10 and the S/D region 50. The contact opening 75G is filled with the second conductive material, thereby forming a contact layer 82G and a wiring layer 87G. The contact layer 82G is in contact with the gate contact 65. The contact opening 75S is filled with the second conductive material, thereby forming a contact layer 82S and a wiring layer 87S. The contact layer 82S is in contact with the S/D contact 60.

As shown in FIG. 11B, the contact layer 82 and the wiring layer 87 do not overlap the fin structure 5. The contact layer 82S and the wiring layer 87S overlap the fin structure 5, while contact layer 82G and the wiring layer 87G do not overlap the fin structure 5.

There is no interface or boundary between the contact layers 82, 82G or 82S and the wiring layers 87, 87G or 87S, respectively in the cross sectional view. Further, the contact layers 82, 82G or 82S have smaller areas than the wiring layers 87, 87G or 87S, respectively, in plan view. As shown in FIG. 11A, the bottoms of the contact layers 82, 82G and 82S are located substantially at the same plane, in which the differences of the height of the bottoms are within about 2 nm.

FIGS. 12-18B show exemplary cross sectional views corresponding to line X1-X1 of FIG. 1A, illustrating various stages of the sequential fabrication process of a semiconductor device according to another embodiment of the present disclosure. It is understood that additional operations can be provided before, during, and after processes shown by FIGS. 12-18B, and some of the operations described below can be replaced or eliminated for additional embodiments of the method. The order of the operations/processes may be interchangeable. The configurations, structures, material, processes and/or operations similar to or the same as the foregoing embodiments described with FIGS. 2-6B may be employed in the following embodiments, and the detailed explanation thereof may be omitted.

Figure 12:
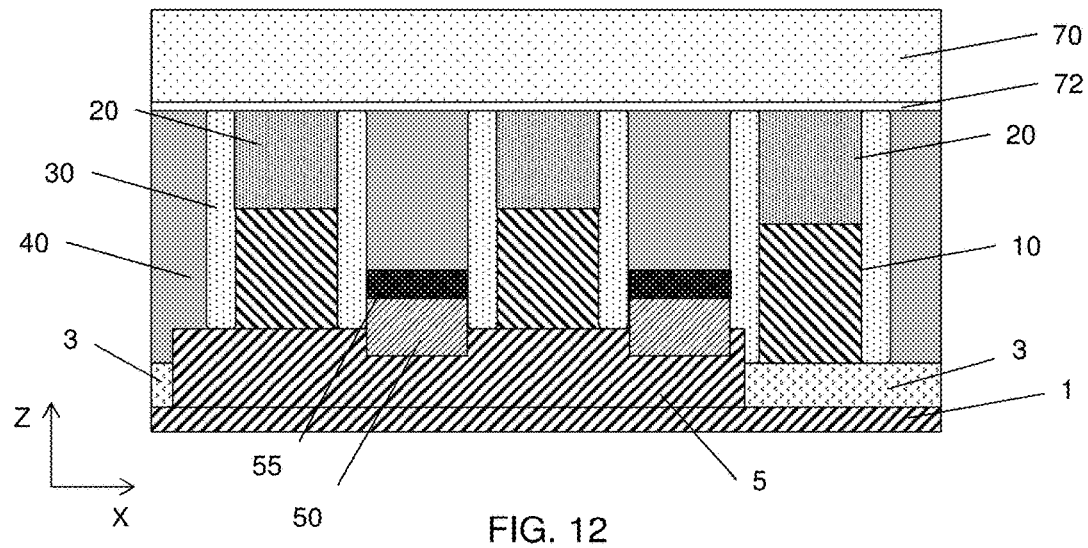
FIGS. 12-18B show exemplary cross sectional views according to another embodiment of the present disclosure.

After the structure of FIG. 3 is formed, a second ILD layer 70 and a CESL 72 are formed, as shown in FIG. 12.

Figure 13:
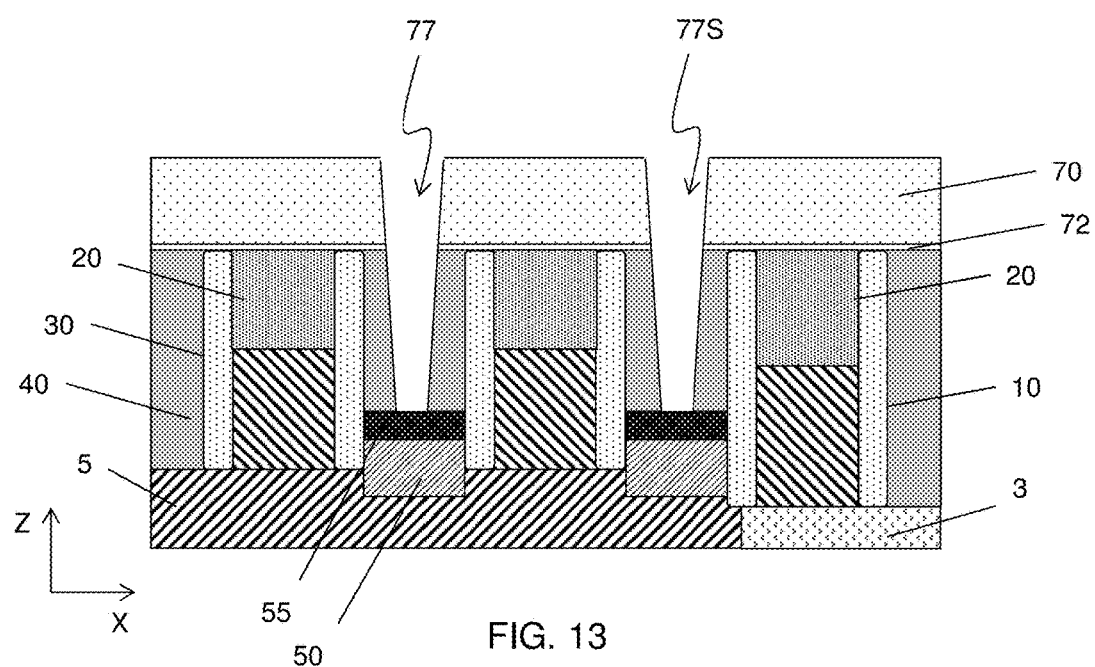

Then, as shown in FIG. 13, S/D contact openings 77 and 77S are formed by etching the second ILD layer 70, the CESL layer 72 and the first ILD layer 40 over the S/D regions.

Figure 14:
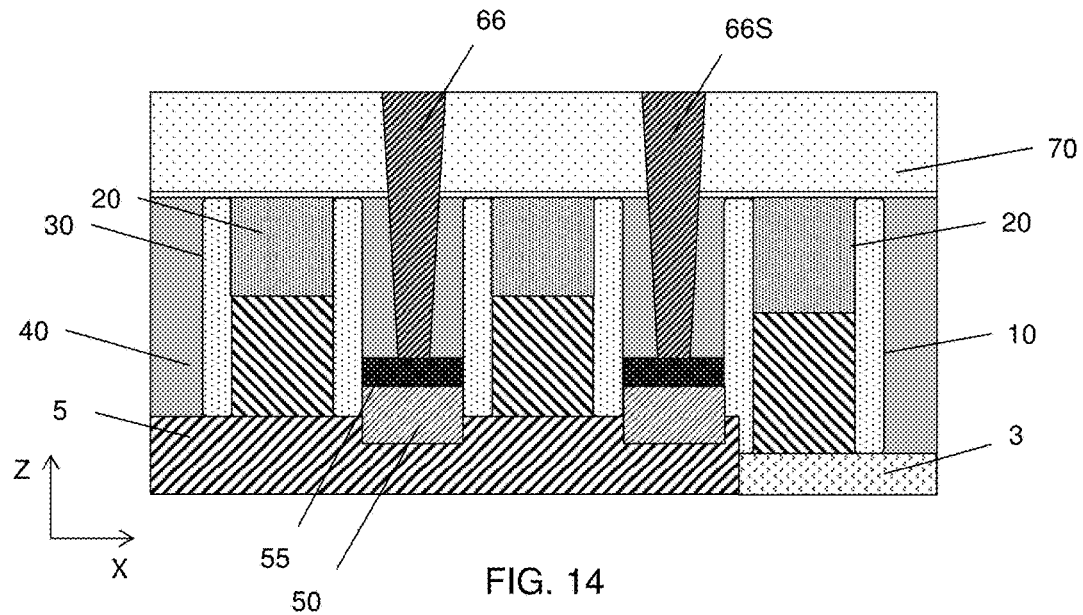

Similar to FIG. 3, S/D contacts 66 and 66S are formed in the openings 77 and 77S to contact the silicide layer 55 of the SD region, as shown in FIG. 14.

Figure 15:
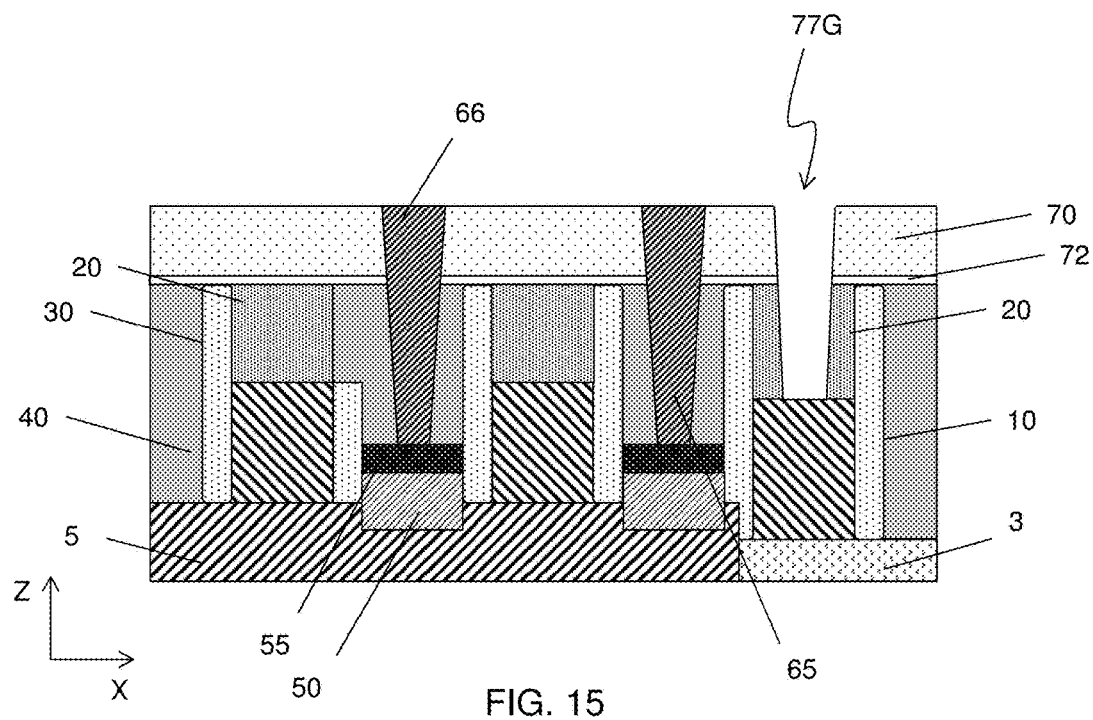

After the structure of FIG. 14 is formed, a gate contact opening 77G is formed by etching the second ILD layer 70, the CESL layer 72 and the cap insulating layer 20, as shown in FIG. 15.

Figure 16:
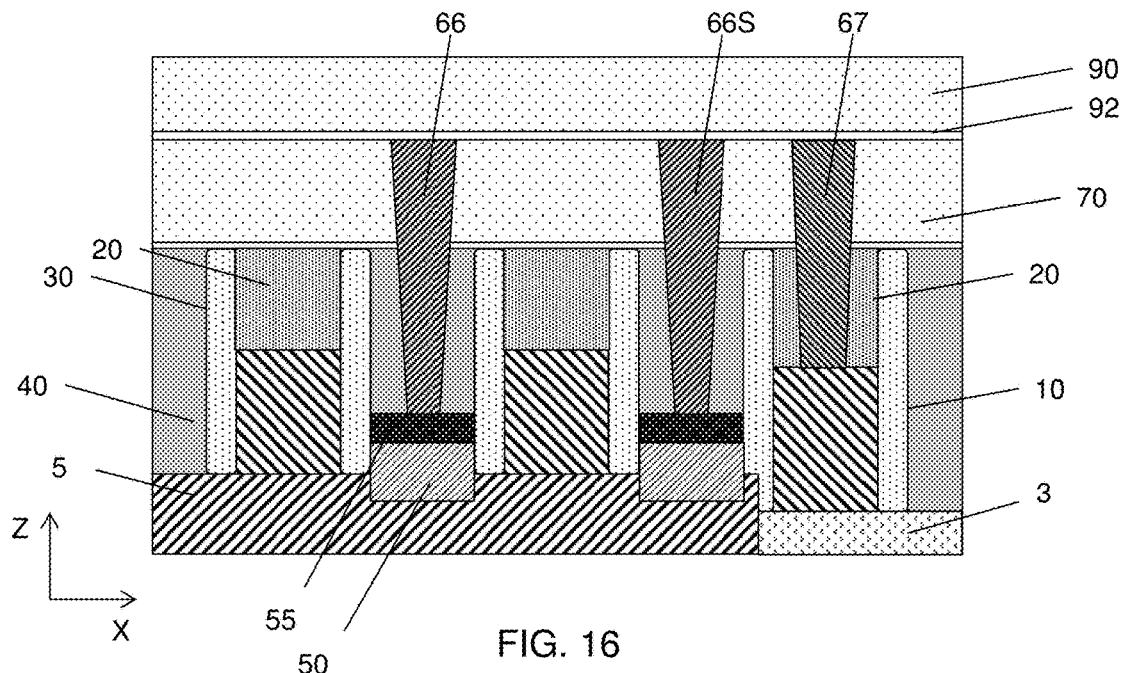

Similar to FIG. 3 or 14, a gate contact plug 67 is formed in the opening 77G to contact the metal gate 10. Further, as shown in FIG. 16, a third ILD layer 90 is formed. In some embodiments, a second CESL 92 is formed between the second ILD layer 70 and the third ILD layer 90.

Figure 17:
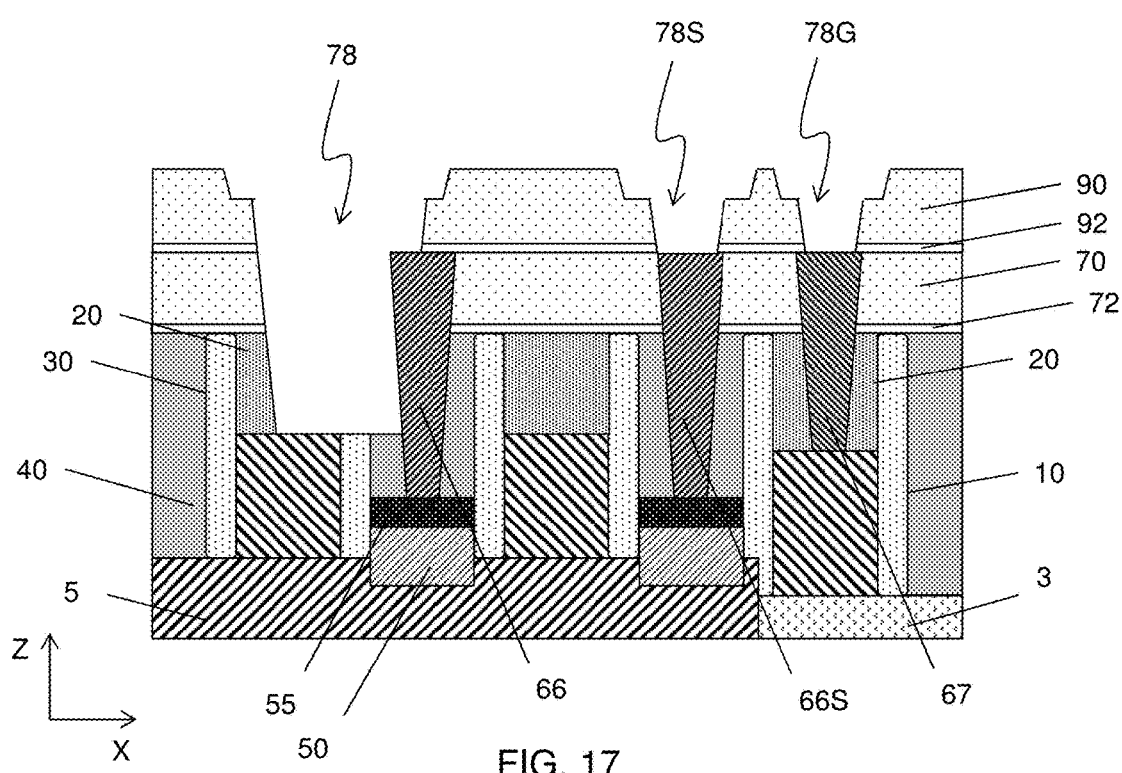

Then, similar to FIG. 5, contact openings 78, 78G and 78S are formed in the first, second and third ILD layers and the cap insulating layer, so as to at least partially expose the S/D contacts 60 and the upper surfaces of S/D contact 60S and the gate contact plug 67, as shown in FIG. 17. As shown in FIG. 17, the contact opening 78 is formed to expose both the S/D contact 60 and the metal gate 10, the contact opening 78S is formed to expose the upper surface of the S/D contact 60S, and the contact opening 83G is formed to expose the upper surface of the gate contact plug 67.

Figure 18A:
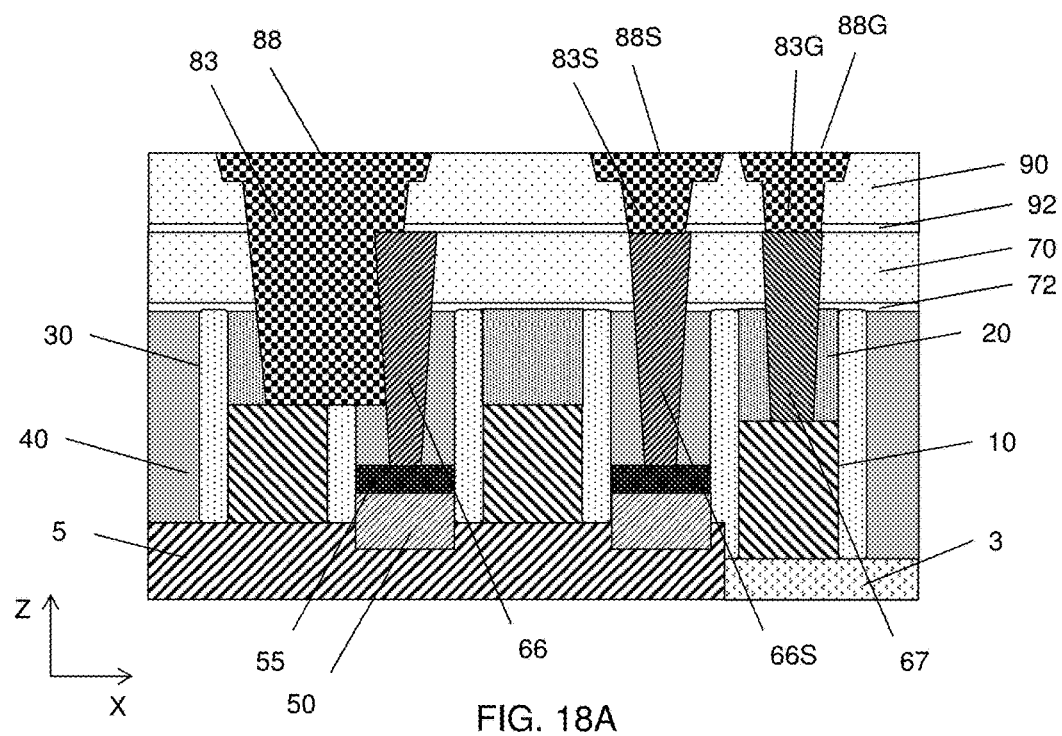
Figure 18B:
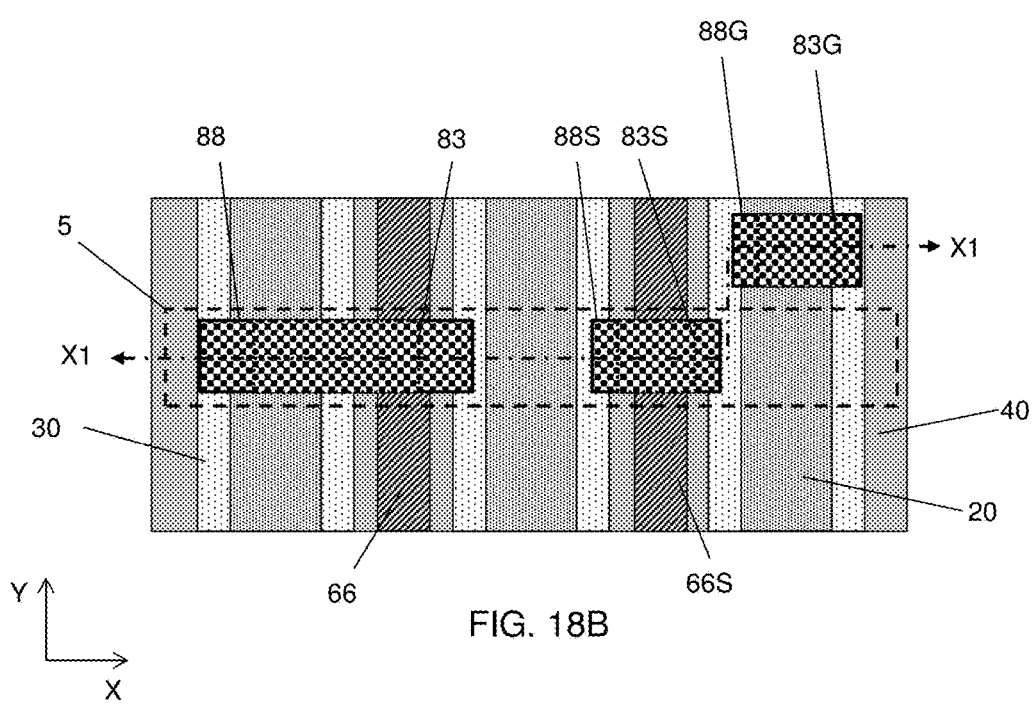

After the contact openings 78, 78G and 78S are formed, a thick second conductive material layer is formed over the structure of FIG. 17, and a planarization operation, such as CMP, is performed to obtain the structure as shown in FIGS. 18A and 18B. FIG. 18B is a plan view and FIG. 18A corresponds to the line X1-X1 of FIG. 18B.

The contact opening 78 is filled with the second conductive material, thereby forming a contact layer 83 and a wiring layer 88. The contact layer 83 is in contact with the metal gate 10 and the S/D contact 60, thereby electrically connecting the metal gate 10 and the S/D region 50. The contact opening 78G is filled with the second conductive material, thereby forming a contact layer 83G and a wiring layer 88G. The contact layer 83G is in contact with the gate contact plug 67. The contact opening 78S is filled with the second conductive material, thereby forming a contact layer 83S and a wiring layer 88S. The contact layer 88S is in contact with the S/D contact 60S.

As shown in FIG. 18B, the contact layer 83 and the wiring layer 88 overlap the fin structure 5. The contact layer 83S and the wiring layer 88S also overlap the fin structure 5, while contact layer 83G and the wiring layer 88G does not overlap the fin structure 5.

There is no interface or boundary between the contact layers 83, 83G or 83S and the wiring layers 88, 88G or 88S, respectively in the cross sectional view. Further, the contact layers 83, 83G or 83S have smaller areas than the wiring layers 88, 88G or 88S, respectively, in plan view. As shown in FIG. 18A, the upper surfaces S/D contacts 66 and 66S and the gate contact plug 67 are located substantially at the same plane, in which the differences of the height is within about 2 nm.

It is noted that the similar structure and manufacturing operations as FIGS. 7-11B may be applied to the embodiments of FIG. 12-18B. In such a case, the wiring layer 87 and the contact layer 82 are formed in the second and third ILD layers, and the contact layer 82 is in contact with the upper surfaces of the gate contact layer 65 and the S/D contact layer 60.

It is understood that the devices shown in FIGS. 6A and 6B, 11A and 11B, and 18A and 18B undergo further CMOS processes to form various features such as interconnect metal layers, dielectric layers, passivation layers, etc.

The various embodiments or examples described herein offer several advantages over the existing art. For example, in the present disclosure, a contact layer formed by a damascene technology is used to directly connect the gate electrode and the S/D contact layer formed on the S/D region, it is possible to increase a flexibility of wiring pattern designing.

It will be understood that not all advantages have been necessarily discussed herein, no particular advantage is required for all embodiments or examples, and other embodiments or examples may offer different advantages.

According to one aspect of the present disclosure, a semiconductor device includes a fin field effect transistor. The semiconductor device includes a first gate electrode, a first source/drain (S/D) region disposed adjacent to the first gate electrode, a first S/D contact disposed on the first S/D region, a first spacer layer disposed between the first gate electrode and the first S/D region, a first contact layer in contact with the first gate electrode and the first S/D contact, and a first wiring layer integrally formed with the first contact layer. There is no interface between the first contact layer and the first wiring layer in a cross sectional view, and the first contact layer has a smaller area than the first wiring layer in plan view.

According to another aspect of the present disclosure, a semiconductor device includes a fin field effect transistor. The semiconductor device includes a first gate electrode, a first gate contact layer disposed on the first gate electrode, a first source/drain (S/D) region disposed adjacent to the first gate electrode, a first S/D contact disposed on the first S/D region, a first spacer layer disposed between the first gate electrode and the first S/D region, a first contact layer in contact with the first gate contact and the first S/D contact, and a first wiring layer integrally formed with the first contact layer. There is no interface between the first contact layer and the first wiring layer in a cross sectional view, and the first contact layer has a smaller area than the first wiring layer in plan view.

In accordance with yet another aspect of the present disclosure, in a method of manufacturing a semiconductor device including a fin field effect transistor, a gate structure is formed over a fin structure. The gate structure includes a gate electrode layer and a cap insulating layer. A source/drain (S/D) contact layer is formed on an S/D structure. An interlayer dielectric layer is formed. A first contact layer and a first wiring layer are formed by using a damascene technique. The contact layer is electrically connected to the gate electrode layer and the S/D contact layer and overlaps the gate electrode and the S/D contact layer in plan view.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a fin field effect transistor, comprising:
    a first gate electrode disposed between gate sidewall spacers made of an insulating material;
    a first source/drain (S/D) region disposed adjacent to the first gate electrode;
    a first S/D contact made of a conductive material and disposed on the first S/D region, the S/D contact being not in direct contact with the first gate electrode;
    a first spacer layer made of an insulating material and disposed between one of the gate sidewall spacers and the first S/D contact;
    a first contact layer made of a conductive material and being in direct contact with the first gate electrode and an uppermost portion and a side face of the first S/D contact; and
    a first wiring layer integrally formed with the first contact layer, wherein:
    there is no interface between the first contact layer and the first wiring layer in a cross sectional view, and the first contact layer has a smaller area than the first wiring layer in plan view.

2. The semiconductor device of claim 1, further comprising a first gate cap insulating layer formed over the first gate electrode,
    wherein a side surface of the first contact layer is in contact with the first gate cap insulating layer.

3. The semiconductor device of claim 1,
    wherein a bottom surface of the first contact layer is in contact with an upper surface of the first spacer layer and an upper surface of the one of the gate sidewall spacers.

4. The semiconductor device of claim 2, further comprising a first interlayer dielectric layer disposed over at least the first cap insulating layer, wherein:
    the first wiring layer is embedded in an upper portion of the first interlayer dielectric layer, and
    the first contact layer penetrates a bottom portion of the first interlayer dielectric layer and the first gate cap insulating layer.

5. The semiconductor device of claim 4, further comprising:
    a second gate electrode;
    a gate contact plug made of a conductive material and being disposed on the second gate electrode;
    a second contact layer made of a conductive material and being in contact with the gate contact plug; and
    a second wiring layer integrally formed with the second contact layer, wherein:
    there is no interface between the second contact layer and the second wiring layer in a cross sectional view,
    the second wiring layer is embedded in the upper portion of the first interlayer dielectric layer, and
    the second contact layer penetrates the bottom portion of the first interlayer dielectric layer and a second gate cap insulating layer.

6. The semiconductor device of claim 5, further comprising:
    a second S/D region;
    a second S/D contact disposed on the second S/D region;
    a third contact layer made of a material and being in contact with the second S/D contact; and
    a third wiring layer integrally formed with the third contact layer, wherein:
    there is no interface between the third contact layer and the third wiring layer in a cross sectional view,
    the third wiring layer is embedded in the upper portion of the first interlayer dielectric layer, and
    the third contact layer penetrates the bottom portion of the first interlayer dielectric layer.

7. The semiconductor device of claim 6, further comprising a fin structure, wherein:
    the first contact layer and the third contact layer are disposed over the fin structure in plan view, and
    the second contact layer is not disposed over the fin structure in plan view.

8. The semiconductor device of claim 6, wherein upper surfaces of the first S/D contact, the second S/D contact and the gate contact plug are located substantially at a same plane.

9. The semiconductor device of claim 1, wherein:
    the first S/D contact includes at least one conductive material selected the group consisting of Co, Ni, W and Mo, and
    the first contact layer includes at least one conductive material selected the group consisting of TiN, Ti, Cu and Al.

10. A semiconductor device including a fin field effect transistor, comprising:
- a first gate electrode disposed between gate sidewall spacers made of an insulating material;
- a first gate contact layer made of a first conductive material and being disposed on the first gate electrode;
- a first source/drain (S/D) region disposed adjacent to the first gate electrode;
- a first S/D contact made of a conductive material and being disposed on the first S/D region, the S/D contact being not in direct contact with the first gate electrode;
- a first spacer layer made of an insulating material and disposed between one of the gate sidewall spacers and the first S/D contact;
- a first contact layer made of a conductive material and being in direct contact with an uppermost portion of the first gate contact layer and an uppermost portion of the first S/D contact;
- a first interlayer dielectric layer disposed over the first gate contact layer and the first S/D contact; and
- a first wiring layer integrally formed with the first contact layer, wherein:
- there is no interface between the first contact layer and the first wiring layer in a cross sectional view,
- the first contact layer has a smaller area than the first wiring layer in plan view,
- the first wiring layer is embedded in an upper portion of the first interlayer dielectric layer,
- the first contact layer penetrates a bottom portion of the first interlayer dielectric layer,
- the first wiring layer protrudes.

11. The semiconductor device of claim 10, wherein a bottom surface of the first contact layer is in contact with an upper surface of the first spacer layer and an upper surface of the one of the gate sidewall spacers.

12. The semiconductor device of claim 10, further comprising:
- a second gate electrode;
- a second gate contact layer disposed on the second gate electrode;
- a second contact layer made of a conductive material and being in contact with the second gate contact layer; and
- a second wiring layer integrally formed with the second contact layer, wherein:
- there is no interface between the second contact layer and the second wiring layer in a cross sectional view,
- the second wiring layer is embedded in the upper portion of the first interlayer dielectric layer, and
- the second contact layer penetrates the bottom portion of the first interlayer dielectric layer.

13. The semiconductor device of claim 12, further comprising:
- a second S/D region;
- a second S/D contact made of a conductive material and being disposed on the second S/D region;
- a third contact layer made of a conductive material and being in contact with the second S/D contact; and
- a third wiring layer integrally formed with the third contact layer, wherein:
- there is no interface between the third contact layer and the third wiring layer in a cross sectional view,
- the third wiring layer is embedded in the upper portion of the first interlayer dielectric layer, and
- the third contact layer penetrates the bottom portion of the first interlayer dielectric layer.

14. The semiconductor device of claim 13, further comprising a fin structure, wherein:
- the third contact layer is disposed over the fin structure in plan view, and
- the first and second contact layers are not disposed over the fin structure in plan view.

15. The semiconductor device of claim 13, wherein upper surfaces of the first S/D contact, the second S/D contact and the gate contact layer are located substantially at a same plane.

16. The semiconductor device of claim 13, wherein bottom surfaces of the first contact layer, the second contact layer and the third contact layer are located substantially at a same plane.

17. The semiconductor device of claim 10, wherein the first gate contact layer includes at least one conductive material selected the group consisting of Co, W and Mo.

18. A method of manufacturing a semiconductor device including a fin field effect transistor, the method comprising:
- forming a gate structure over a fin structure, the gate structure including a gate electrode layer disposed between gate sidewall spacers made of an insulating material and a cap insulating layer;
- forming a source/drain (S/D) contact, the S/D contact being not in direct contact with the gate electrode and passing through an insulating layer formed adjacent to the gate spacer layers and contacting an S/D structure;
- forming an interlayer dielectric layer;
- etching a part of the interlayer dielectric layer, a part of the cap insulating layer, a part of one of the gate sidewall spacers and a part of the insulating layer, thereby forming an opening in which at least a part of an upper surface of the gate electrode layer and at least a part of an upper surface and at least a part of a side surface of the S/D contact are exposed; and
- forming a contact layer and a first wiring layer by filling the opening with a conductive material, wherein:
- the contact layer is electrically connected to the gate electrode layer and the S/D contact and overlaps the gate electrode and the S/D contact layer in plan view.

19. The method of claim 18, wherein the contact layer is in direct contact with the gate electrode and the S/D contact.

20. The method of claim 18, wherein:
- the S/D contact includes at least one conductive material selected the group consisting of Co, Ni, W and Mo, and
- the contact layer is includes at least one conductive material selected the group consisting of Ti, TiN, Cu and Al.

21. The method of claim 20, wherein the gate contact layer includes at least one conductive material selected the group consisting of Co, W and Mo.

* * * * *